United States Patent
Kaneyama

(10) Patent No.: US 7,030,389 B2
(45) Date of Patent: Apr. 18, 2006

(54) ELECTRON BEAM APPARATUS HAVING ELECTRON ANALYZER AND METHOD OF CONTROLLING LENSES

(75) Inventor: Toshikatsu Kaneyama, Akiruno (JP)

(73) Assignee: JEOL Ltd., Tokyo (JP)

( * ) Notice: Subject to any disclaimer, the term of this patent is extended or adjusted under 35 U.S.C. 154(b) by 21 days.

(21) Appl. No.: 10/764,136

(22) Filed: Jan. 23, 2004

(65) Prior Publication Data
US 2004/0188608 A1  Sep. 30, 2004

(30) Foreign Application Priority Data
Jan. 23, 2003 (JP) ................ 2003-14751

(51) Int. Cl.
*G01K 1/08* (2006.01)
*G01N 23/00* (2006.01)
*G21K 7/00* (2006.01)

(52) U.S. Cl. ................ 250/399; 250/311
(58) Field of Classification Search ........ 250/396 ML, 250/396 R, 310, 311, 399
See application file for complete search history.

(56) References Cited

U.S. PATENT DOCUMENTS

| 4,851,768 A | * | 7/1989 | Yoshizawa et al. ......... 324/751 |
| 5,300,775 A | * | 4/1994 | Van der Mast ............. 250/305 |
| 5,578,823 A | * | 11/1996 | Taniguchi ................... 250/311 |
| 5,798,524 A | * | 8/1998 | Kundmann et al. ......... 250/305 |

FOREIGN PATENT DOCUMENTS

| JP | 11-086771 | 3/1999 |
| JP | 2000-268766 | 2/2000 |

* cited by examiner

*Primary Examiner*—Nikita Wells
*Assistant Examiner*—Kalimah Fernandez
(74) *Attorney, Agent, or Firm*—The Webb Law Firm

(57) ABSTRACT

An electron beam apparatus having an electron analyzer is achieved which can control the illumination lens system by feedback without adversely affecting the imaging action even if a specimen is positioned within the magnetic field of the objective lens. The apparatus has an energy shift control module for controlling energy shift. On receiving instructions about setting of energy shift from the CPU, the control module issues an instruction for shifting the accelerating voltage to a specified value to an accelerating-voltage control module. The control module also sends information about the energy shift to an energy shift feedback control module, which calculates the feedback value and supplies information about corrections of lenses and deflection coils to a TEM optics control module. The feedback value is multiplied by a corrective coefficient that can be calibrated.

7 Claims, 7 Drawing Sheets

ELECTRON BEAM APPARATUS HAVING ELECTRON ANALYZER AND METHOD OF CONTROLLING LENSES

BACKGROUND OF THE INVENTION

1. Field of the Invention

The present invention relates to an electron beam apparatus for focusing an electron beam onto a specimen with condenser lenses and an objective lens to image electrons transmitted through the specimen and, more particularly, to an electron beam apparatus which has an electron analyzer and acts to image only electrons having an energy coincident with the characteristic absorption energy of a certain element transmitted through the specimen.

2. Description of Related Art

Electron microscopes are roughly classified into two types: transmission electron microscope and scanning electron microscope. In a transmission electron microscope, an electron beam produced and accelerated from an electron gun is focused onto a specimen by condenser lenses and an objective lens. Electrons transmitted through the specimen or scattered electrons are imaged onto a fluorescent screen, photographic film, or TV camera.

Sometimes, such a transmission electron microscope is fitted with an energy filter. In this instrument fitted with the energy filter, only electrons transmitted through a specimen and having characteristic absorption energy coincident with that of a certain element are imaged. Thus, information about the specimen, such as elemental distribution, can be obtained. The phenomenon where the energies of electrons are absorbed by a specimen is known as energy loss. Analysis of the energy loss is known as energy loss spectroscopy.

This energy filter is often mounted behind the image. The image is detected by an image tube or the like by making use of electrons transmitted through an energy-selecting slit or aperture baffle. A certain energy loss image can be derived by appropriately setting the width and position of the slit.

Although an energy loss image of a certain element in the specimen can be obtained in this way, the background level of the energy loss spectrum is high in practice. It is essential to subtract the background to extract information about the certain element from such a spectrum. Some methods are used in practice to subtract the background in this manner. These methods are described below.

First, the two-window method is described by referring to FIG. 1, which is an illustration of energy loss spectrum. In this graph, the energy loss value is plotted on the horizontal axis and the electron intensity corresponding to each energy loss value on the vertical axis. In the case of this two-window method, an image (A) of energy loss value of interest is obtained. In addition, an image (B) of a lower energy loss value is obtained. Signal processing given by A−B or A/B is performed and thus information about a desired certain element is obtained. The latter calculation is performed to acquire an intensity ratio rather than background subtraction. Therefore, the ratio may be referred to as the jump ratio.

Now, the three-window method is described by referring to FIG. 2. In this method, an image (A) of an energy loss value of interest is obtained. In addition, two images (B) and (C) of lower energy loss values are taken. The background of the image (A) is estimated from the two image signals (B) and (C). The value of the background is indicated by (D). Signal processing given by A−D is performed.

In the above-described estimation of the background, the relation between the intensity of energy-loss spectrum and energy-loss value is derived. This depends on the actual electron energy and on the state of the specimen, i.e., contained elements and thickness of the specimen. A calculation must be performed for each individual appropriate model of the interaction between material and electron.

Some interaction models have been proposed. Any one of them is used according to the element or energy to be imaged. Since such an interaction model is not directly related to the present invention, its detailed description is omitted. In any case, however, the loss energy value is switched, and plural filtered images are acquired. Computational processing is performed between the gained image signals.

When images of differing losses are obtained, electrons for generating the images are introduced into an analyzer, which energy-disperses the electrons. Only those of the energy-dispersed electrons which have a certain energy value are passed through an output slit located after the analyzer. An image is obtained only from electrons having the certain energy value by an image pickup device, such as a CCD camera. Often, a sector magnetic field is used as this analyzer. The energy of the electrons passed through the output slit is varied by varying the strength of the magnetic field.

An example of an electron microscope fitted with this analyzer is shown in FIG. 3, where electrons accelerated from an electron gun 1 with an accelerating voltage E are illuminated on a specimen 3 as an electron beam by an illumination lens system 2. This illumination lens system 2 includes a combination of condenser lenses and a magnetic pre-field of the objective lens.

Electrons transmitted through the specimen 3 or scattered electrons are imaged onto the incident aperture baffle 6 of the analyzer 5 by an imaging lens system 4. The energies of some of the electrons are absorbed on passing through the specimen, while the energies of other electrons are absorbed according to the elements constituting the specimen. The electrons passed through an opening of the incident aperture baffle 6 enter the analyzer 5.

A magnetic field is set up within the analyzer 5. The electrons incident on the analyzer 5 are deflected by the magnetic field. The angle through which the electrons are deflected differs depending on the energy. That is, the electrons are energy-dispersed by the analyzer 5. A slit baffle 7 is mounted on the exit side of the analyzer 5. The electrons passed through an opening of the slit baffle 7 are only electrons having energy E corresponding to the strength of the magnetic field in the analyzer 5.

Electrons which have been deflected greatly by the analyzer 5 and have energies (E−δE) smaller than energy E are blocked out by the slit baffle 7. The electrons passed through the slit baffle 7 and having the certain energy E are imaged onto the sensitive surface of the image recording device 9, such as a CCD camera, by an imaging lens system 8. As a result, electrons having a certain energy are detected as an image by the image recording device 9. In this case, if the strength of the magnetic field forming the analyzer 5 is swept, the energy of the electron passed through the opening of the slit baffle 7 is varied by varying the strength of the magnetic field.

The analyzer 5 described above forms a sector-shaped magnetic field, and the strength of the magnetic field is varied. The following configuration is also possible. The strength of the magnetic field is maintained constant. An electrically conductive tube is mounted in the electron passage within the analyzer. A constant potential is applied to the tube from a power supply 10 shown in FIG. 4 to vary the electron energy temporarily. The energy of the electron passed through the opening of the slit baffle 7 is swept. In the example of FIG. 4, the potential inside the analyzer 5 is increased, and electrons having lower energy (E−δE) are passed through the slit baffle 7. Electrons having higher energy E are blocked out by the slit baffle 7.

FIG. 5 shows another example in which the energy of the electron passed through the opening of the slit baffle 7 is varied. In the configuration of this FIG. 5, the slit baffle 7 is made movable relative to the front and rear stages of electron optics. If the slit baffle 7 is moved in the direction of the arrow in the figure, electrons having different energies can be selectively passed through the opening of the slit baffle 7. In the example of FIG. 5, the opening of the slit baffle 7 is moved into the position where the electrons of the lower energy (E−δE) are imaged. On the other hand, the electrons having the energy E and imaged onto the optical axis are blocked out by the slit baffle 7.

FIG. 6 shows an example in which the energy is selected without varying the conditions of the analyzer 5 and without mechanically moving the slit baffle 7. In the configuration of this FIG. 6, a deflection coil 11 is disposed between the analyzer 5 and slit baffle 7. Electrons exiting from the analyzer 5 and dispersed are deflected by the deflection coil 11. Thus, electrons having different energies can be passed through the opening of the slit baffle 7.

FIG. 7 shows an example in which the energy is selected without varying the conditions of the analyzer 5, without mechanically moving the slit baffle 7, and without using a deflection coil. In the configuration of this FIG. 7, the accelerating voltage of the electron gun 1 is varied to change the energy of the electrons illuminating on the specimen. For example, the voltage with which the electrons are accelerated in the electron gun 1 is varied from E to E' (E'=E+δE) (increased in this case).

Consequently, the spectrum on the slit baffle 7 shifts. The energy loss value of the electrons passed through the slit coincides with the increment δE in the illuminating energy. That is, electrons passed through the opening of the slit baffle 7 have energy E. Electrons having the energy E and passed through the slit baffle 7 up to now come to have energy of E+δE. In consequence, the electrons are blocked off by the slit baffle 7. On the other hand, electrons having energy of E'−δE come to have $$E'-\delta E=(E+\delta E)-\delta E=E$$

As a result, the electrons are bent by the analyzer 5 and pass through the opening of the slit baffle 7 on the optical axis. In this way, electrons can also be passed through an electronic slit of desired energy loss value by varying the accelerating voltage of the electron gun 1.

Electron microscopes fitted with the aforementioned energy filter are disclosed in Japanese Patent Laid-Open No. 2000-268766 and Japanese Patent Laid-Open No. H11-86771. Where an image is formed by selecting electrons of a certain energy, a tube is mounted in a sector-shaped magnetic field in the beam path. A voltage is applied to the tube to vary the energy of the electrons. Moreover, a system in which a filter, such as an Ω-filter, α-filter, or γ-filter, is positioned in the electron optical system is used.

As mentioned previously, four methods are conceivable to switch the loss energy. In practice, these methods are in operation. In the first method, one condition of the analyzer 5 (e.g., the strength of the sector-shaped magnetic field) is varied as shown in FIGS. 3 and 4 or a certain voltage is applied to the beam path in the analyzer and the energy of the electron is varied temporarily, thus moving the spectrum. In the second method, the exit slit baffle 7 mounted in the rear stage of the analyzer 5 shown in FIG. 5 is moved mechanically.

In the third method, the deflection coil 11 is mounted between the analyzer 5 and slit baffle 7 as shown in FIG. 6. In the fourth method, the energy of the electron beam illuminated on the specimen 3 is varied by varying the accelerating voltage of the electron gun 1 as shown in FIG. 7.

Of the four methods described above, the first and fourth methods have been performed widely. In the second method, the slit baffle 7 is moved mechanically and therefore, if the accuracy at which the mechanical movement is made is enhanced to a quite high level, the accuracy is unsatisfactory compared with the energy resolution. Furthermore, the reproducibility of image presents a problem. In addition, extra cost is spent for the moving mechanism.

In the third method, the position of the opening of the slit fails to agree with the optical axis of the imaging lens system mounted behind the slit baffle 7 and so aberration and axial misalignment occur. In this way, the second and third methods have great problems. Consequently, the first and fourth methods are used but they still have both advantages and disadvantages.

For example, in the first method, the spectrum can be moved with high reproducibility by sweeping the magnetic field in the analyzer or by maintaining the magnetic field constant and applying a potential to the tube in the beam passage within the analyzer 5. Also, axial misalignment of the electrons passed through the slit baffle 7 with respect to the imaging lens system 8 after the analyzer 5 is not produced. Furthermore, no axial misalignment occurs in the illumination lens system 2 or imaging lens system 4 before the analyzer 5 because the set conditions are not varied at all.

However, in both the imaging lens system 8 after the analyzer 5 and the imaging lens system 4 before the analyzer 5, conditions (e.g., focusing) are accurately set for electrons without energy loss (zero-loss electrons) before a potential is applied to the tube in the analyzer 5. Accordingly, where the tube potential is varied, if the energy of the electrons imaged is varied by applying the tube potential, the set conditions are no longer satisfied for the electrons unless all other conditions for the lenses and deflection system are varied in relation with the tube potential. That is, defocusing occurs.

In the fourth method, the accelerating voltage of the electron beam illuminated on the specimen 3 is varied. The conditions for the illumination lens system 2 in front of the specimen 3 are no longer satisfied, producing axial misalignment. However, after transmission through the specimen, desired energy-loss electrons have an actual energy coincident with the lens conditions and so the image is not defocused. Accordingly, the fourth method is generally adopted in an energy filter that selects electrons of a desired energy with the energy-selecting slit baffle 7 and brings the electrons to an image.

As mentioned previously, the problem with the fourth method is that the conditions of the illuminating lens system 2 deviate. This may shift the region on the specimen 3 illuminated with the electron beam or the brightness of the illuminating electron beam may vary, degrading the accuracy of signal processing. Therefore, a method of providing feedback control has been proposed. In particular, the conditions of the illumination optical system including the illuminating lens system 2 and deflection coil 40 for axial alignment are varied according to variation of the accelerating voltage such that the region on the specimen illuminated with the beam and the brightness of the illuminating beam remain unchanged if the accelerating voltage of the electron beam is varied or increased.

As described above, where the accelerating voltage of the electron beam is varied, it is necessary to vary the operating conditions of the illumination optical system 2, because the strengths of the lenses and the strength of the deflection coil are in proportion to the square root of the relativistic energy of each lens. More specifically, let E be the energy prior to increase of the accelerating voltage. Let E* be the relativistic energy. Let E' (=E+δE) be the energy of the electron beam after the accelerating voltage is increased. Let E'* be the relativistic value of this energy E'. There is the following relation among the energy not yet increased, the current I flowing into the lenses and deflection coil, and the current I' flowing into them after the increase:

$$\frac{I'}{I} = \sqrt{\frac{E'^*}{E^*}}$$

For these reasons, where the accelerating voltage of the electron beam is varied, the operating conditions of the lenses and deflection coil of the illumination optical system are controlled by feedback to prevent positional deviation of the electron beam on the specimen 3 and brightness variations.

In the normal transmission electron microscope, the specimen is placed within the magnetic field of the objective lens 20. The magnetic field before the specimen acts as an illumination lens. The magnetic field after the specimen acts as an imaging lens. This means that correct operation cannot be expected unless feedback to the illumination optical system located ahead of the specimen is also applied to the objective lens 20. It is impossible, however, in practice to control the illuminating action of the objective lens 20 and the imaging action separately. In spite of this, if the strength of the magnetic field of the objective lens 20 ahead of the specimen 3 is controlled by feedback according to variation of the accelerating voltage, the imaging action of the magnetic field of the objective lens 20 behind the specimen 3 is adversely affected. This defocuses the image. As a result, the purpose cannot be achieved with the feedback to the illuminating lens system.

SUMMARY OF THE INVENTION

It is an object of the present invention to provide an electron beam apparatus having an electron analyzer capable of controlling the illuminating lens system by feedback without adversely affecting the imaging action even if a specimen is placed within the magnetic field of the objective lens 20.

An electron beam apparatus having an electron analyzer according to the present invention has: an illumination optical system consisting of lenses and deflection means for illuminating electrons at a specimen, the electrons being produced and accelerated from an electron gun; an imaging optical system for imaging electrons transmitted through the specimen positioned within the magnetic field of an objective lens 20; and the electron analyzer having a detection system for detecting the imaged electrons and energy selection means for energy-dispersing the detected electrons and selecting electrons having a certain energy. The accelerating voltage of the electron gun is varied to shift the energy of the detected electrons. Signals supplied to the lenses and deflection means of the illumination optical system are corrected using amounts of correction each obtained by multiplying an energy shift value corresponding to a variation in the accelerating voltage by a corrective coefficient. As a result, where the accelerating voltage of the electron gun is varied to cause an energy shift, the operating conditions of the illumination lens system are prevented from deviating; otherwise, the region on the specimen illuminated with the electron beam would be shifted or the illumination brightness of the beam would vary.

Other objects and features of the invention will appear in the course of the description thereof, which follows.

DESCRIPTION OF THE PREFERRED EMBODIMENTS

Figure 1:
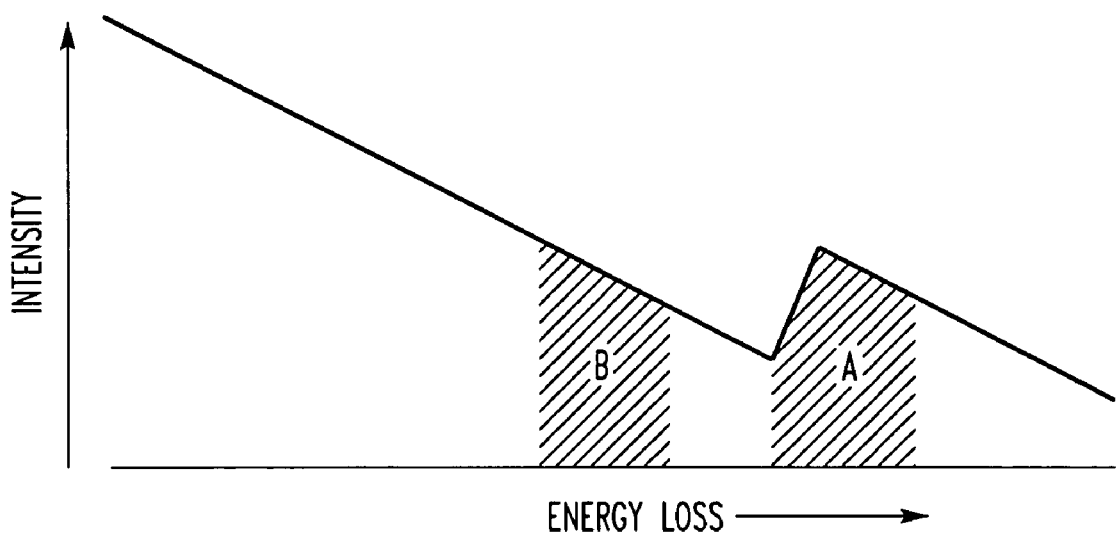
FIG. 1 is a graphic representation of energy loss, illustrating a two-window method for background subtraction.
Figure 2:
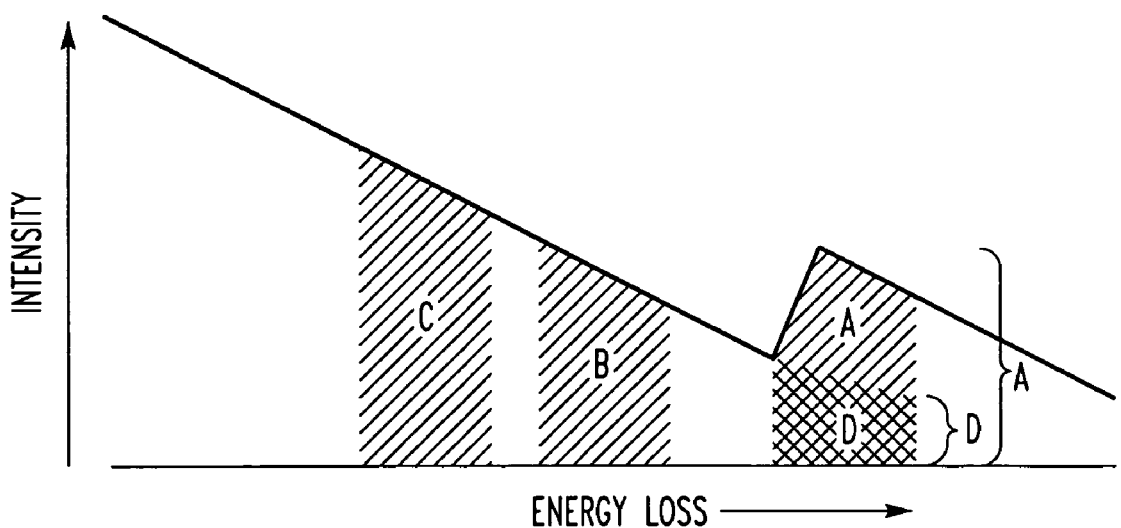
FIG. 2 is a graphic representation of energy loss, illustrating a three-window method for background subtraction.
Figure 3:
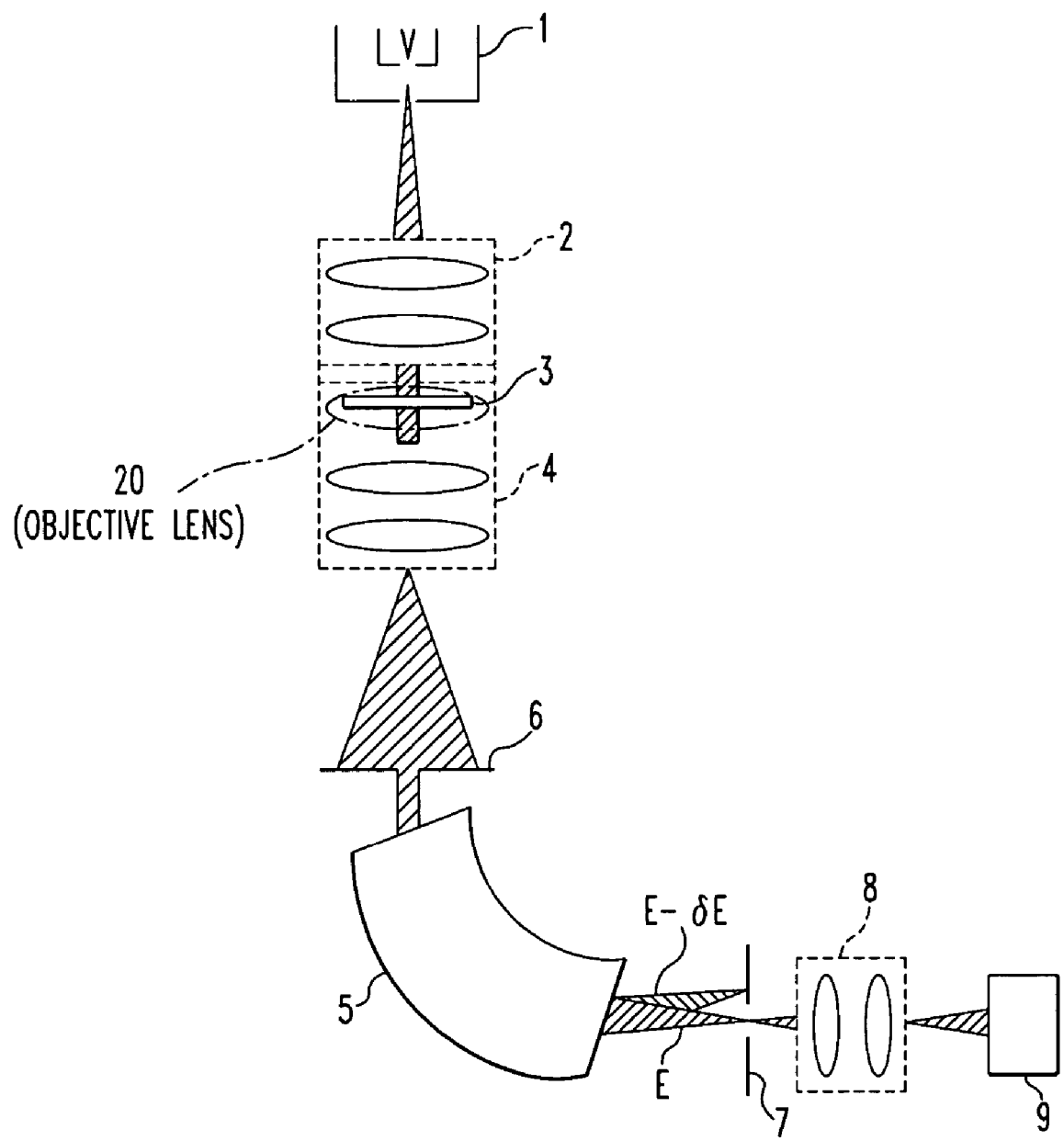
FIG. 3 shows an electron microscope fitted with an analyzer.
Figure 4:
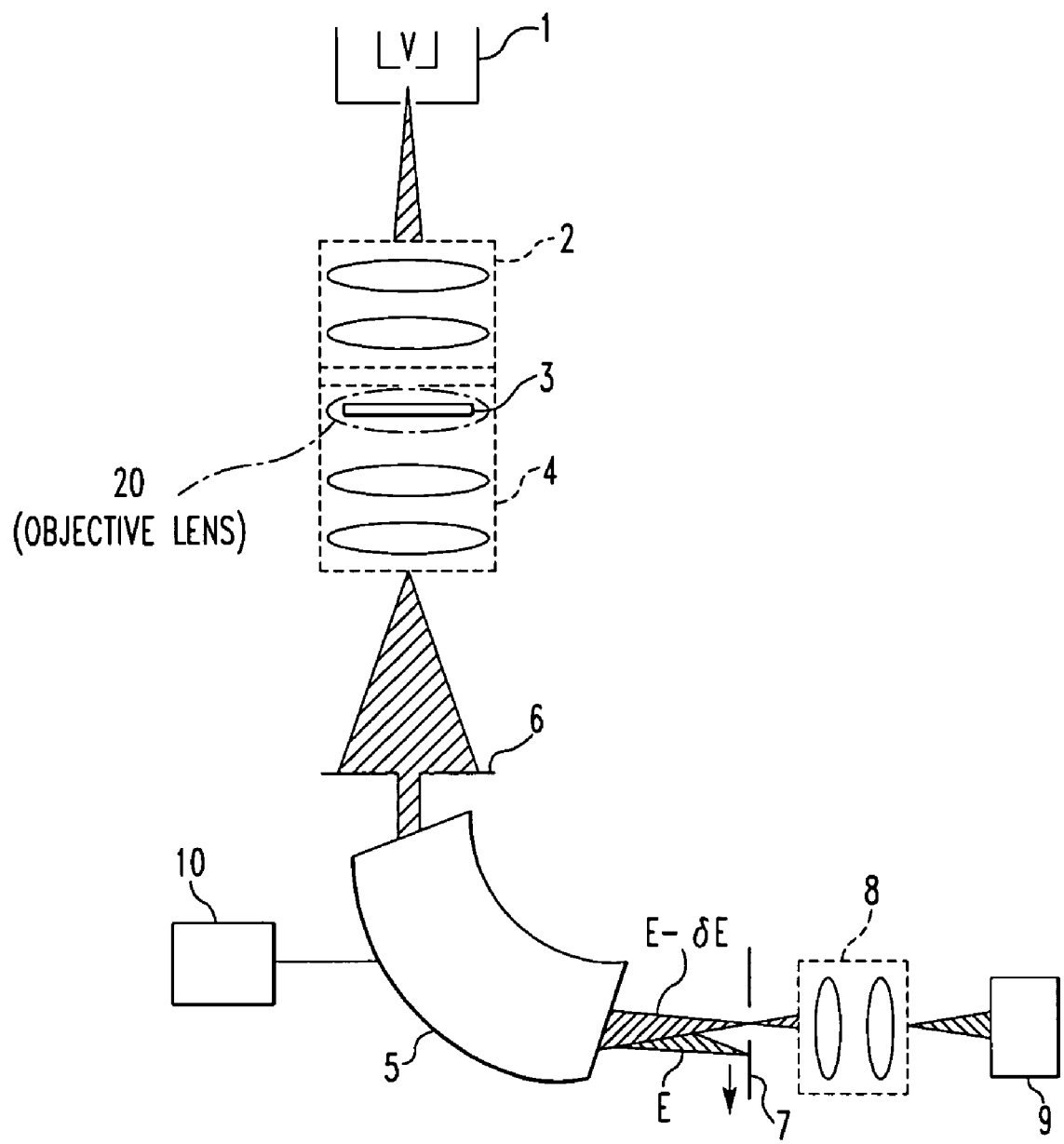
FIG. 4 shows another electron microscope fitted with an analyzer.
Figure 5:
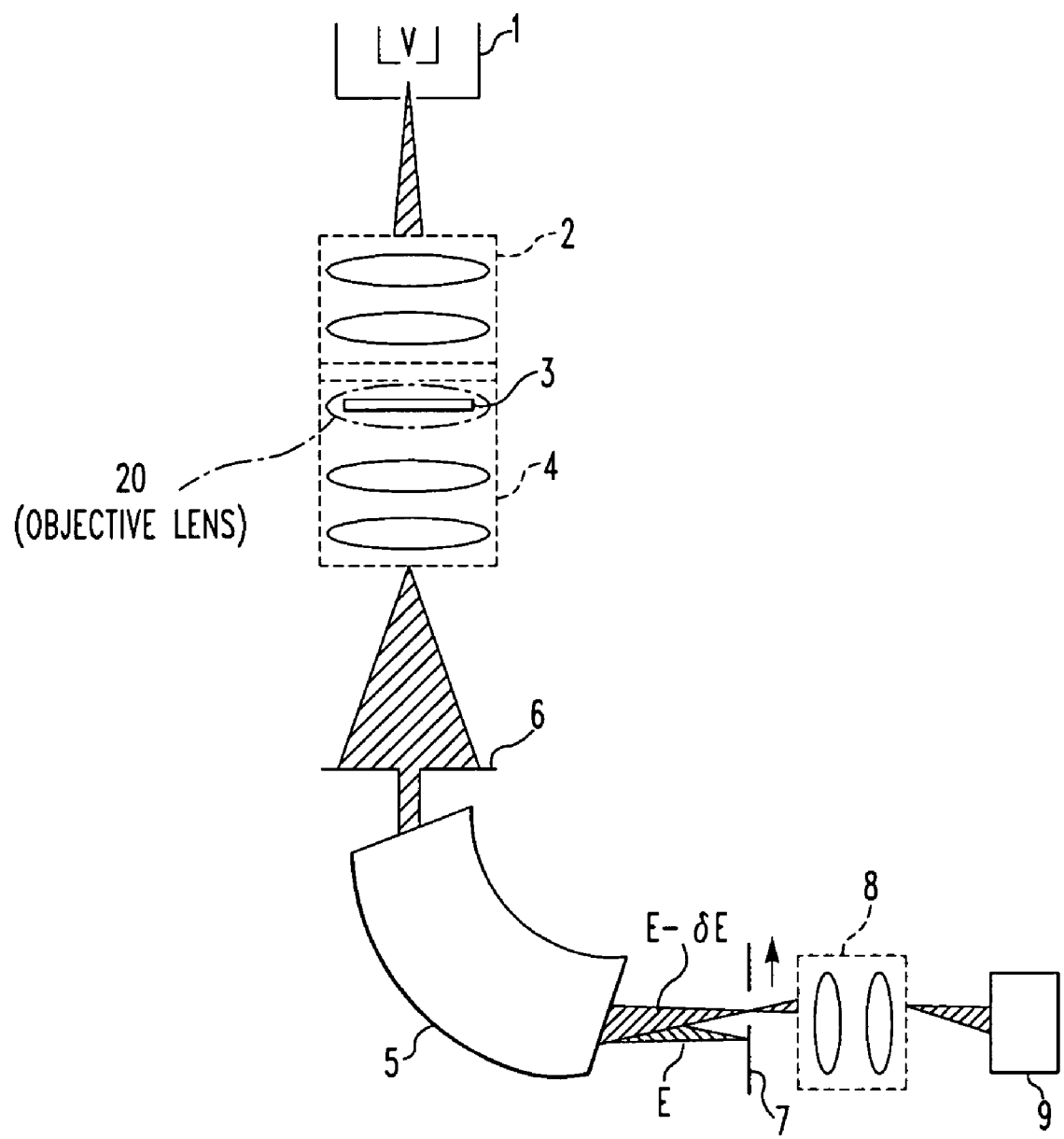
FIG. 5 shows a further electron microscope fitted with an analyzer.
Figure 6:
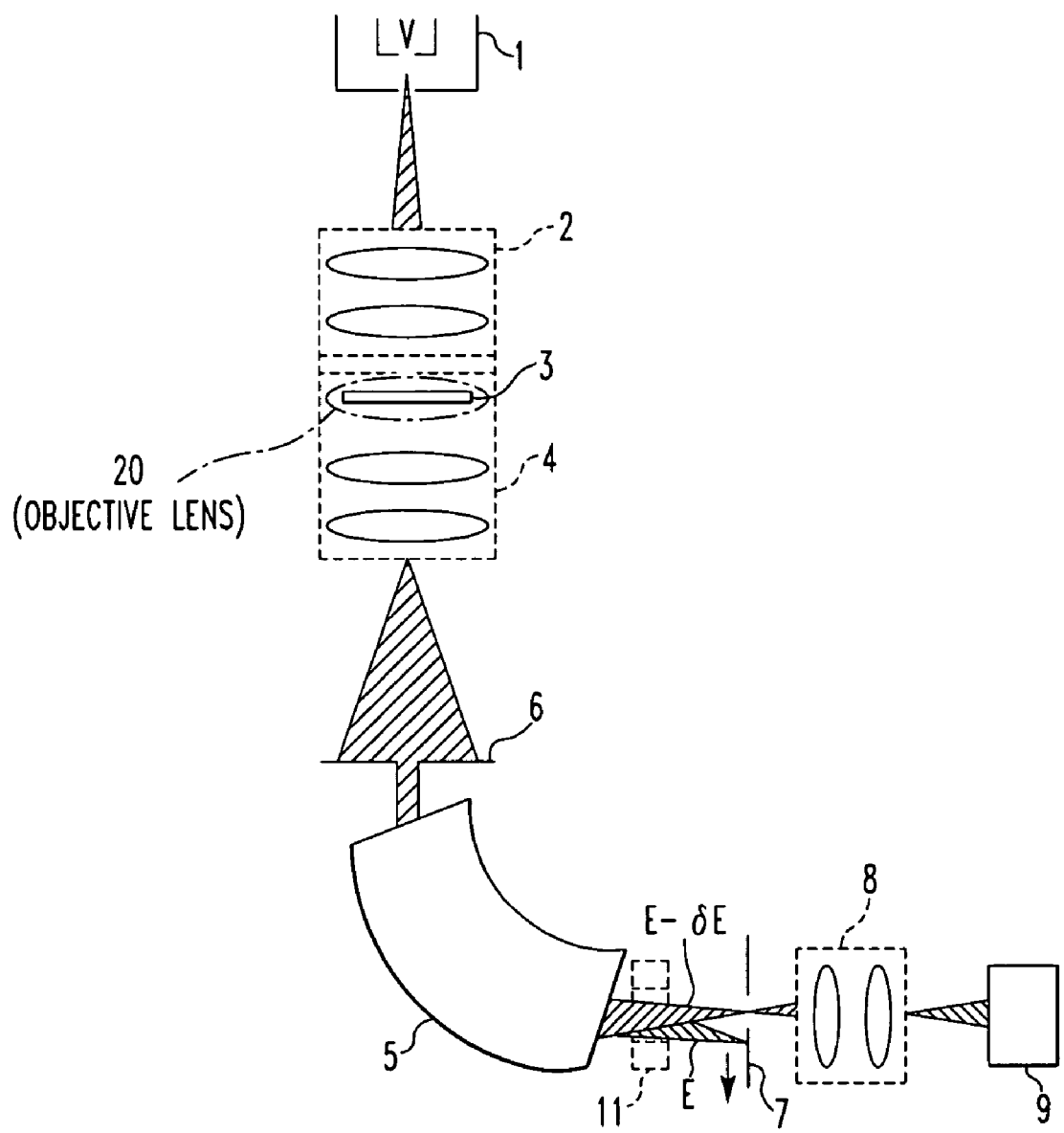
FIG. 6 shows still another electron microscope fitted with an analyzer.
Figure 7:
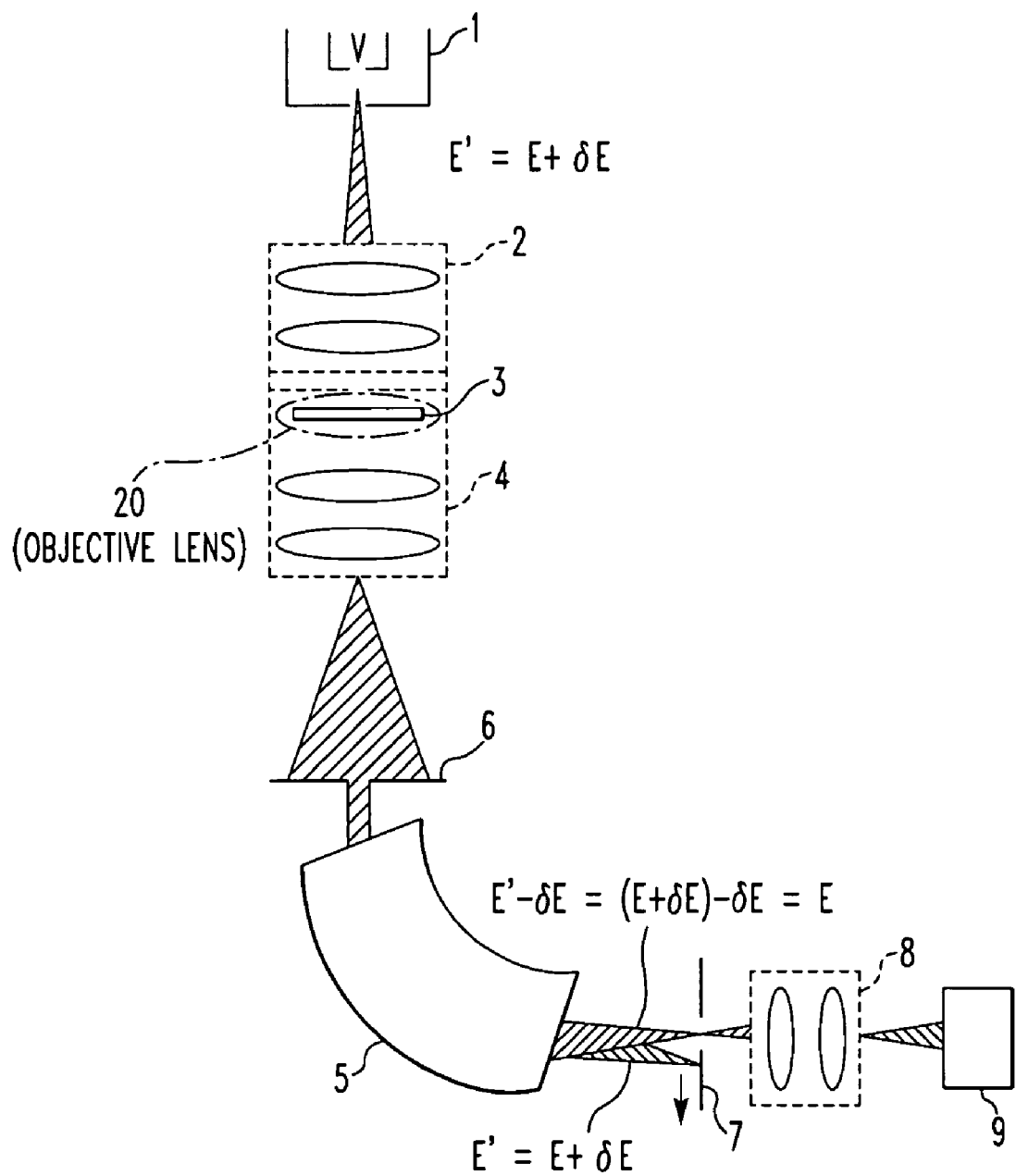
FIG. 7 shows yet another electron microscope fitted with an analyzer.
Figure 8:
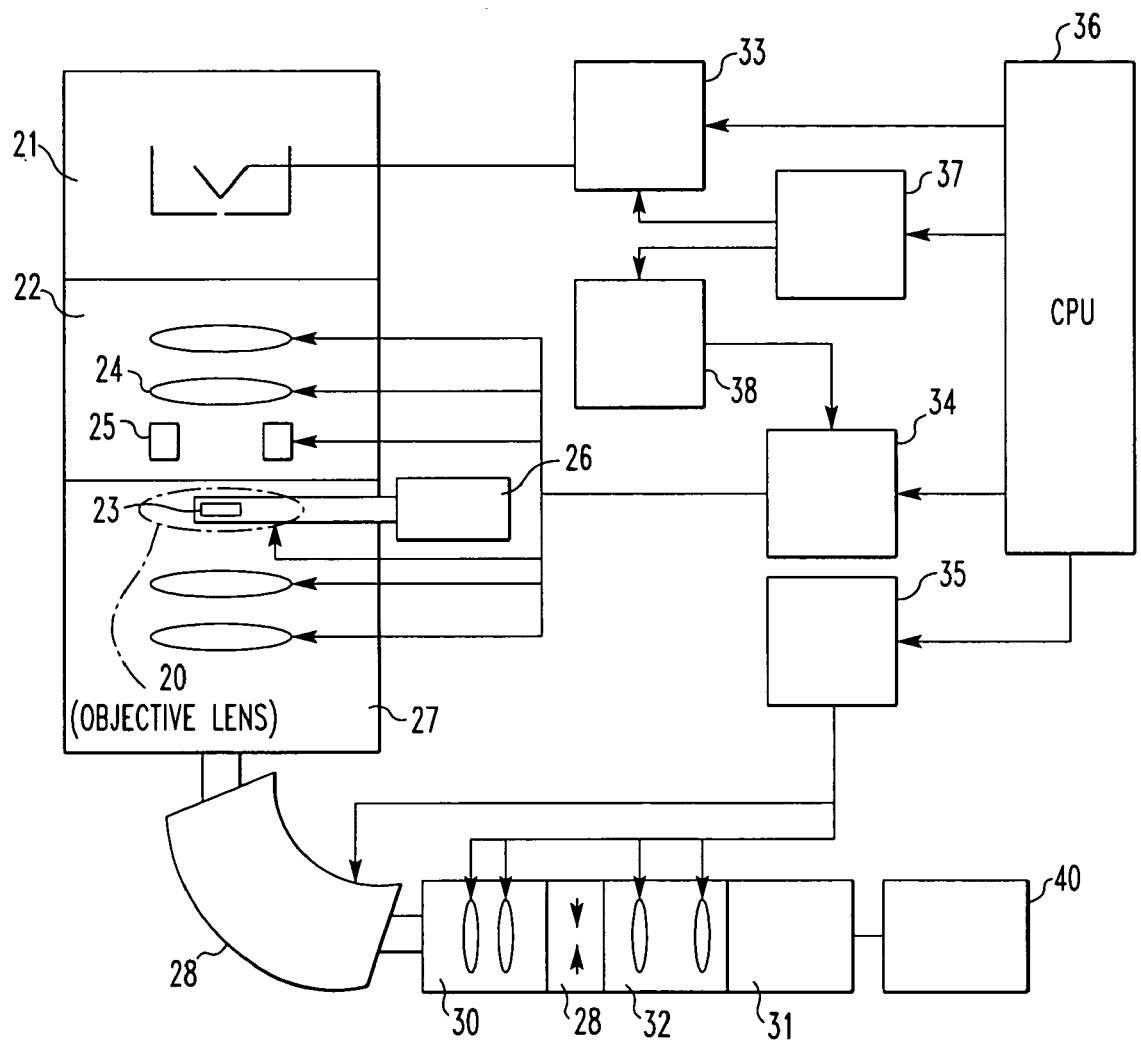
FIG. 8 shows a transmission electron microscope that is one embodiment of the present invention.

Embodiments of the present invention are hereinafter described in detail with reference to the accompanying drawings. FIG. 8 shows a transmission electron microscope according to the present invention. This microscope has an electron gun 21 producing and accelerating an electron beam. The beam is condensed by an illumination optical system 22 and illuminated at a specimen 23. The illumination optical system 22 includes plural condenser lenses 24 and deflection coils 25 for axial correction. The specimen 23 is held in a specimen holder 26 mounted to a specimen stage (not shown).

An imaging optical system 27 for imaging a TEM image is mounted behind the specimen holder 26 and fitted with plural lenses and plural deflection coils. An electron energy analyzer 28 is mounted behind the imaging optical system 27. In the present embodiment, a sector-shaped magnetic field is used as the analyzer. Incident electrons are dispersed within the analyzer according to their energies. An Ω-filter, α-filter, or γ-filter can be used as the energy analyzer 28.

An energy-selecting slit baffle 29 for passing only electrons having a selected energy is positioned behind the analyzer 28. A pre-slit imaging optical system 30 for imaging energy-dispersed electrons emerging from the analyzer 28 onto the slit baffle 29 is mounted ahead of the slit baffle 29. A post-slit imaging optical system 32 for imaging electrons of a certain energy passed through the opening of the slit baffle 29 onto a detector 31, such as a CCD camera, is mounted behind the slit baffle 29. The output signal from the detector 31 is supplied to a display device or signal processor 40 for obtaining an energy-loss spectrum.

An accelerating-voltage control module 33 is connected with the electron gun 21. The accelerating voltage of the electron gun 21 is controllably applied by this control module 33. An optics control module 34 is connected with the lenses and deflection coils contained in the illumination optical system 22 and imaging optical system 27. The currents and voltages applied to these lenses and deflection coils are controlled by this optics control module 34. The energy analyzer 28, pre-slit imaging optical system 30, and post-slit imaging optical system 32 are controlled by a filter optics control module 35.

The accelerating voltage control module 33, optics control module 34, and filter optics control module 35 are under control of a CPU 36. When an accelerating voltage is specified from the CPU 36, the accelerating voltage control module 33 sets the accelerating voltage to be applied to the electron gun 21 to the specified value. The CPU 36 also controls the optics control module 34 to control the currents supplied from the optics control module 34 to the lenses and deflection coils contained in the illumination optical system 22 and in the imaging optical system 27. Furthermore, the CPU 36 controls the filter optics control module 35 such that an electron image of a certain energy is imaged onto the sensitive surface of the detector 31.

In addition, the CPU 36 controls an energy shift control module 37, which, in turn, controls the accelerating-voltage control module 33 to vary the value of the accelerating voltage, thus shifting the energy of the electron beam. An energy shift feedback control module 38 under control of the energy shift control module 37 controls the optics control module 34 to vary the amounts of current supplied to the lenses and deflection coils according to the accelerating voltage. The operation of the instrument constructed in this way is described below.

The electron beam produced and accelerated from the electron gun 21 is condensed by the illumination optical system 22 and illuminated at the specimen 23. At this time, the accelerating voltage of the electron gun 21 is set from the CPU 36 via the accelerating-voltage control module 33. The illumination conditions under which the electron beam is illuminated at the specimen 23 are controlled by the optics control module 34.

Electrons transmitted through the specimen 23 are imaged by the imaging optical system 27. The magnification of the image and the conditions under which the electrons enter the energy analyzer 28 are controlled by the optics control module 34. The analyzer 28 spectrally resolves the incident electrons and guides them to the pre-slit imaging optical system 30 of the filter imaging optical system. This pre-slit imaging optical system 30 guides the spectrally resolved energy spectrum to the energy-selecting slit baffle 29, and acts to enlarge the spectrum and correct aberration or distortion. Note that the pre-slit imaging optical system 30 is not essential. A transmission electron microscope fitted with an energy filter that does not have this optical system also exists.

The slit baffle 29 acting as a filter causes only electrons having an appropriate energy width centered at a selected energy value to pass through the opening of the slit. The electrons passed through the slit baffle 29 enter the post-slit imaging optical system 32. This optical system 32 enlarges the incident electrons and images a projection image of the specimen 23 onto the sensitive surface of the rear-stage detector 31 operating as an image tube, such as a CCD camera. As a result, an energy-loss image of the specimen owing to electrons having the appropriate energy width centered at the selected energy is displayed on the display device 40, such as a CRT or liquid-crystal panel connected with the detector 31.

In the present embodiment, when an energy-loss image owing to electrons of different energies is acquired, the accelerating voltage of the electron gun 21 is varied. The flow of processing for acquiring an image while shifting the electron energy is described below.

First, the operator manipulates the mouse or keyboard connected with the CPU 36 to perform an operation for shifting the energy. Then, the CPU 36 gives instructions for setting the energy shift to the energy shift control module 37. This control module 37 issues instructions for shifting the accelerating voltage to the specified value to the accelerating voltage control module 33 and transfers information about the energy shift to the energy shift feedback control module 38. This feedback control module 38 calculates a feedback value based on the information about the energy shift and on feedback conditions defined separately and supplies corrective information about the lenses and deflection coils to the TEM optics control module 34.

The illumination optical system of the TEM undergoes feedback control based on the instructions for the energy shift in this way. The amount of feedback is found from the above-described equation, i.e., $$\frac{I'}{I} = \sqrt{\frac{E'^*}{E'}} \qquad (1)$$

As mentioned previously, in this equation, E is the energy prior to shifting of the accelerating voltage, E* is the relativistically modified value of the energy, E' (=E+δE) is the energy of the electron beam after the accelerating voltage has been increased, and E'* is the relativistically modified value of this energy E'.

From the above equation, the amount of correction δI of the illumination optical system is found to be equal to I–I' (δI=I–I'). This amount of correction is applied to the lenses 24 and deflection coils 25 of the illumination optical system 22. The amount by which the electron beam is deflected by the lens strength and deflection coils is corrected according to the amount of shift of the accelerating voltage. This correction is not applied to the objective lens 20.

Since the lens strength of the objective lens 20 is not feedback-controlled, it cannot be said that the illumination optical system 22 is completely corrected by a shift of the accelerating voltage. That is, this is due to the fact that the magnetic field of the objective lens 20 produced ahead of the specimen is not corrected in a corresponding manner to the shift of the accelerating voltage. The instrument is so designed that the correction for the objective lens 20 is assigned to other illumination lenses 24 and deflection coils 25.

Specifically, the amount of correction for the illumination lenses 24 relative to the energy shift value is measured in advance and stored in the memory within the energy shift feedback control module 38. Similarly, the value of the deflection coils 25 relative to the energy shift value is measured in advance and stored in the memory within the energy shift feedback control module 38. Accordingly, the energy shift feedback control module 38 finds the amount of lens correction and the amount of deflection coil correction by performing the following calculations:

[Amount of lens correction]=[Corrective Coefficient of Lens]×[Energy shift value][Amount of deflection coil correction]=[Corrective Coefficient of deflection coil]×[Energy shift value]     (2)

The corrective coefficients of the above equations can be calibrated.

In the aforementioned feedback control, one condenser lens 24 in the illumination optical system 22 is used as the lens for correcting the lens strength. Alternatively, a combination of plural condenser lenses or all condenser lenses may be corrected. Similarly, in the above feedback control, one deflection coil 25 in the illumination optical system 22 is used. Alternatively, a combination of plural deflection coils or all deflection coils may be corrected. Furthermore, an additional lens or deflection coil may be mounted for correction.

The calibration is next described. To facilitate the understanding, it is assumed here that one of the corrective condenser lenses 24 is corrected in terms of strength and that one of the corrective deflection coils 25 is corrected in terms of deflecting field.

The aforementioned corrective coefficients depend on the operating conditions of the illumination optical system and on the energy shift value to be achieved. Accordingly, if necessary, the corrective coefficients need to be reset. That is, a calibration is necessary. The procedure of this calibration is as follows.

First, desired illumination conditions (such as the illuminate position of the electron beam and the illumination size) are adjusted at some energy shift value $\delta E_1$ (e.g., 0 eV meaning no energy shift). The value $I_1$ of the current through the corrective condenser lens 24 and the values $IX_1$ and $IY_1$ of the current through the corrective deflection coil 25 which are taken at this time are stored in the memory within the feedback control module 38. Then, the energy shift value is set to $\delta E_2$. The values of the currents supplied to the corrective condenser lens 24 and corrective deflection coil 25 are adjusted to produce the same illumination conditions as the illumination conditions (such as the illuminate position of the electron beam and the illumination size) produced when the energy shift value was $\delta E_1$. The value $I_2$ of the current through the corrective condenser lens 24 and the values $IX_2$ and $IY_2$ of the current through the corrective deflection coil 25 which are produced at this time are stored in the memory within the feedback control module 38.

Corrective coefficients KI, KDx, and KDy are calculated based on the values found in this way, i.e., the value of the current through the corrective condenser lens 24, the values $I_1$, $I_2$ of the current through the corrective deflection coil 25, and the values $IX_1$, $IY_1$, $IX_2$, and $IY_2$ of the current through the corrective deflection coil 25. The calculations are performed by the energy shift feedback control module 38 based on the following equations:

$KI=(I_2-I_1)/(\delta E_2-\delta E_1)$ $KDx=(IX_2-IX_1)/(\delta E_2-\delta E_1)$ $KDy=(IY_2-IY_1)/(\delta E_2-\delta E_1)$ The corrective coefficients are found by the procedure described above. The corrective values $\delta I$, $\delta IX$, and $\delta IY$ for the energy shift value $\delta E$ are calculated using the following equations.

$\delta I=KI\times\delta E$ $\delta IX=KDx\times\delta E$ $\delta IY=KDy\times\delta E$ The corrective values found by the above-described calculations are supplied to the TEM optics control module 34. In this module, the current value to the condenser lens 24 is corrected using the amount of correction $\delta I$. Also, the amount of deflection to the deflection coil 25 in the X-direction is corrected using the amount of correction $\delta IX$. The amount of correction in the Y-direction is corrected using the amount of correction $\delta IY$. As a result, even where the accelerating voltage of the electron gun 21 is varied to thereby vary the selected electron energy, the position and brightness of the electron beam illuminating the specimen 23 are prevented from being affected.

While one embodiment of the present invention has been described so far in connection with FIG. 8, the invention is not limited to the structure shown in FIG. 8, but rather other modifications are possible. For example, in the embodiment of FIG. 8, each corrective coefficient is a linear function, i.e., a straight line. If higher-order functions are adopted, more accurate corrections may be made.

In the embodiment described so far, lenses and deflection coils that are corrected are of the existing constructions. New lens and deflection coil may be provided and used to correct the electron beam that is made to illuminate the specimen when an energy shift is caused. Furthermore, in the above embodiment, the accelerating voltage of the electron gun is varied to cause an energy shift. Thus, the operating conditions of the illumination optical system are corrected according to above-mentioned Equation (1). Additionally, the magnetic field component of the objective lens 20 produced ahead of the specimen is corrected by the lens and deflection coil located ahead of the objective lens 20 according to above-mentioned Equation (2). However, practically sufficient advantages can be obtained by correcting the illumination lenses and deflection coils according to above-mentioned equation (2) without correcting the illumination optical system according to above-mentioned equation (1). In this case, it is preferable to calibrate the corrective coefficients correctly.

It is also to be understood that the invention can be applied to every instrument that obtains elemental information contained in the specimen by energy-loss electron spectroscopy. In the embodiment described already in detail in connection with FIG. 8, electrons are energy-dispersed by a single sector-type magnet. The invention can also be applied to an instrument in which electrons are dispersed by plural magnets and to an instrument using any type of analyzer in which electrons are energy-dispersed by an Ω-filter, α-filter, γ-filter, or the like. Of course, as described previously, the invention can be applied to the magnetic field type for dispersing electrons. Besides, the invention can be applied to an instrument using electrostatic deflection coils or electrostatic mirrors and to an instrument using such electrostatic deflection coils or mirrors in combination with magnets.

As described so far, an electron beam apparatus having an electron analyzer according to the present invention has an illumination optical system consisting of lenses and deflecting means for illuminating electrons at a specimen, the electrons being produced and accelerated from an electron gun, an imaging optical system for imaging electrons transmitted through the specimen positioned inside the magnetic field of the objective lens, a detection system for detecting electrons, and energy selection means for energy-dispersing electrons and selecting electrons having a certain energy. This apparatus is characterized in that the accelerating voltage of the electron gun is varied to shift the energy of electrons and that signals supplied to the lenses and deflection means of the illumination optical system are corrected using amounts of correction each obtained by multiplying an energy shift value corresponding to a variation in the accelerating voltage by a corrective coefficient.

As a result, where an energy shift is caused by varying the accelerating voltage of the electron gun, shift of the illuminated region on the specimen and variations in the illumination brightness of the electron beam are prevented if the operating conditions of the illumination lens system deviate. Furthermore, the strength of the magnetic field of the objective lens formed ahead of the specimen can be corrected by calibrating the corrective current values and appropriately adjusting the values of the currents flowing through the lenses and deflection coils in the illumination optical system.

Having thus described my invention with the detail and particularity required by the Patent Laws, what is desired protected by Letters Patent is set forth in the following claims:

1. An electron beam apparatus having an electron analyzer, comprising:
    an illumination optical system consisting of lenses and deflection means for illuminating electrons at a specimen, the electrons being produced and accelerated from an electron gun;
    an imaging optical system for directing electrons transmitted through the specimen positioned within a magnetic field of an objective lens; and
    said electron analyzer having a detection system for detecting the imaged electrons and energy selection means for energy-dispersing the detected electrons and selecting electrons having a certain energy,
    wherein an accelerating voltage of the electron gun is varied to shift the detected energy of electrons and signals supplied to the lenses and deflection means of the imaging optical system are corrected for focus and position using amounts of correction each obtained by multiplying an energy shift value corresponding to a variation in the accelerating voltage by a corrective coefficient.

2. An electron beam apparatus having an electron analyzer as set forth in claim 1, wherein the corrective coefficients can be calibrated.

3. An electron beam apparatus having an electron analyzer as set forth in claim 1, wherein corrective coefficient KI of the lenses and corrective coefficients KDx and KDy of the deflection means are calculated based on equations $$KI=(I_2-I_1)/(E_2-E_1)$$

$$KDx=(IX_2-IX_1)/(E_2-E_1)$$

$$KDy=(IY_2-IY_1)/(E_2-E_1)$$

where $I_1$ is the value of the current through the corrective lens and $IX_1$, $IY_1$ are the values of the current through the corrective deflection means when the energy shift is a first energy shift value of $E_1$, $I_2$ is the value of the current through the corrective lens, and $IX_2$, $IY_2$ are the values of the current through the corrective deflection means when the energy shift is a second energy shift value of $E_2$.

4. An electron beam apparatus having an electron analyzer as set forth in claim 3, wherein lens-correcting value I when the energy shift assumes a value of E and correcting values IX and IY for the deflection means are found using equations $$I=KI\ E$$

$$IX=KDx\ E\ IY=KDy\ E.$$

5. An electron beam apparatus having an electron analyzer as set forth in claim 1, wherein the energy selection means for selecting electrons having a certain energy is an analyzer for energy-dispersing electrons by the use of a magnetic field.

6. An electron beam apparatus having an electron analyzer as set forth in claim 1, wherein the energy selection means for selecting electrons having a certain energy is an analyzer for energy-dispersing electrons by the use of an electric field.

7. A method of controlling lenses in an electron beam apparatus having an illumination optical system consisting of lenses and deflection means for illuminating electrons at a specimen, the electrons being produced and accelerated from an electron gun, an imaging optical system for imaging electrons transmitted through the specimen positioned within a magnetic field of an objective lens, and the electron analyzer having a detection system for detecting the imaged electrons and energy selection means for energy-dispersing the detected electrons and selecting electrons having a certain energy, said method comprising the steps of:
    varying an accelerating voltage of the electron gun to shift the detected energy of electrons; and
    correcting signals supplied to the lenses and deflection means of the illumination optical system using amounts of correction for focus and position each obtained by multiplying an energy shift value corresponding to a variation in the accelerating voltage by a corrective coefficient.

* * * * *